United States Patent
Ogane et al.

(10) Patent No.: US 10,117,341 B2
(45) Date of Patent: Oct. 30, 2018

(54) CONTROLLER AND MANUFACTURING METHOD THEREOF

(71) Applicant: Mitsuba Corporation, Gunma (JP)

(72) Inventors: Takahiko Ogane, Kiryu (JP); Fumiaki Koshio, Kiryu (JP); Wataru Kusumoto, Kiryu (JP); Masamichi Ishii, Kiryu (JP); Yoshihisa Yamada, Kiryu (JP); Iwao Tsurubuchi, Kiryu (JP)

(73) Assignee: Mitsuba Corporation, Gunma (JP)

( * ) Notice: Subject to any disclaimer, the term of this patent is extended or adjusted under 35 U.S.C. 154(b) by 0 days.

(21) Appl. No.: 15/518,293

(22) PCT Filed: Oct. 7, 2015

(86) PCT No.: PCT/JP2015/078500
§ 371 (c)(1),
(2) Date: Apr. 11, 2017

(87) PCT Pub. No.: WO2016/060046
PCT Pub. Date: Apr. 21, 2016

(65) Prior Publication Data
US 2017/0325341 A1  Nov. 9, 2017

(30) Foreign Application Priority Data

Oct. 15, 2014  (JP) .................................. 2014-210620
Apr. 17, 2015  (JP) .................................. 2015-085326

(51) Int. Cl.
*H05K 5/00* (2006.01)
*H01L 25/07* (2006.01)
(Continued)

(52) U.S. Cl.
CPC ........... *H05K 5/0017* (2013.01); *B29C 70/72* (2013.01); *B29C 70/84* (2013.01); *B29C 70/882* (2013.01);
(Continued)

(58) Field of Classification Search
CPC .... H05K 5/0017; H05K 5/0217; B29C 70/72; B29C 70/84; B29C 70/882; B29D 99/006; H01R 13/50; H01R 27/02; H01R 43/18
See application file for complete search history.

(56) References Cited

U.S. PATENT DOCUMENTS

| 7,035,105 | B2 * | 4/2006 | Yamaguchi | B60R 16/0238 165/80.3 |
| 8,907,230 | B2 * | 12/2014 | Chen | H01R 13/5216 174/520 |
| 2001/0012708 | A1 * | 8/2001 | Mizuno | H05K 1/142 439/76.1 |

FOREIGN PATENT DOCUMENTS

| CN | 101434254 A | 5/2009 |
| CN | 102104348 A | 6/2011 |

(Continued)

OTHER PUBLICATIONS

PCT Office, International Search Report issued in corresponding PCT Application No. PCT/JP2015/078500 dated Dec. 22, 2015, 2 pages.
(Continued)

*Primary Examiner* — Nidhi Thaker
(74) *Attorney, Agent, or Firm* — Wood Herron & Evans LLP

(57) ABSTRACT

A controller (1) includes a primary molded portion (11) in which a resin molded body (10) is integrated with a bus bar (100) using a resin, causing one end of the bus bar (100) to function as a connector terminal which protrudes into con-
(Continued)

nector portions (13) to (15), and configured to form electronic component disposition portions (16a) to (16d) in which an electronic component (40) is disposed and a power device disposition portion (17) in which a power device (50) is disposed, and a secondary molded portion (21) integrated with the electronic component (40), the power device (50), and the primary molded portion (11) in a state in which the electronic component (40) is disposed at the electronic component disposition portions (16a) to (16d) and the power device (50) is disposed at the power device disposition portion (17).

9 Claims, 8 Drawing Sheets

(51) Int. Cl.
| | |
|---|---|
| *H02G 3/10* | (2006.01) |
| *B29C 70/72* | (2006.01) |
| *B29C 70/84* | (2006.01) |
| *B29C 70/88* | (2006.01) |
| *B29D 99/00* | (2010.01) |
| *H01R 13/50* | (2006.01) |
| *H01R 27/02* | (2006.01) |
| *H01R 43/18* | (2006.01) |
| *H05K 5/02* | (2006.01) |
| *H05K 5/06* | (2006.01) |
| *B29L 31/34* | (2006.01) |

(52) U.S. Cl.
CPC .......... *B29D 99/006* (2013.01); *H01L 25/07* (2013.01); *H01R 13/50* (2013.01); *H01R 27/02* (2013.01); *H01R 43/18* (2013.01); *H02G 3/105* (2013.01); *H05K 5/0034* (2013.01); *H05K 5/0217* (2013.01); *H05K 5/065* (2013.01); *B29K 2995/0069* (2013.01); *B29L 2031/3481* (2013.01)

(56) References Cited

FOREIGN PATENT DOCUMENTS

| CN | 103996662 A | | 8/2014 |
|---|---|---|---|
| EP | 1119228 A2 | | 7/2001 |
| EP | 1448037 A2 | | 8/2004 |
| JP | 08064916 A | | 3/1996 |
| JP | 2001211529 A | | 8/2001 |
| JP | 2002093959 A | * | 3/2002 |
| JP | 2004248426 A | | 9/2004 |
| JP | 2010112293 A | | 5/2010 |
| JP | 2014060206 A | | 4/2014 |
| JP | 2014132626 A | | 7/2014 |

OTHER PUBLICATIONS

Chinese Patent Office, Office Action issued in Chinese Patent Application No. 201580055202.9 dated Nov. 1, 2017, 7 pages.
Chinese Patent Office, Office Action issued in Chinese Patent Application No. 201580055202.9 dated May 30, 2018, 16 pages.
Japanese Patent Office, Notice of Allowance issued in Japanese Patent Application No. 2015-085326 dated May 8, 2018, 6 pages.

* cited by examiner

CONTROLLER AND MANUFACTURING METHOD THEREOF

TECHNICAL FIELD

The present invention relates to a controller and a manufacturing method thereof.

Priority is claimed on Japanese Patent Application No. 2014-210620, filed Oct. 15, 2014 and Japanese Patent Application No. 2015-085326, filed Apr. 17, 2015, the content of which are incorporated herein by reference.

BACKGROUND ART

Generally, a controller which drives a driven electric body such as a motor includes a configuration which protects a substrate which is disposed inside the controller, an electronic component such as a noise suppression device mounted on the substrate, a semiconductor device, and the like. For example, in a controller (a circuit board unit) disclosed in Patent Document 1, a substrate is sealed using an upper case and a lower case. However, in such a configuration, a waterproof seal structure for securing waterproof property is necessary at a joint portion between the upper case and the lower case. Also, in the case of the controller configuration disclosed in Patent Document 1, since a space is formed therein, a fixing structure for an electronic component or a stress relaxation structure for a terminal of an electronic component are necessary as a vibration countermeasure for the electronic component disposed therein. Further, if there is a space inside, a ventilation mechanism for adjusting a pressure difference between the inside and outside of the controller is also required, and thus there is a problem in that the number of parts is increased.

In response to the above problem, in a controller (a device for driving a motor) disclosed in Patent Document 2, internal airtightness is enhanced by molding the entire integrated circuit which is a power device including an electronic component and a semiconductor device using a resin, for example.

CITATION LIST

Patent Literature

[Patent Document 1]
Japanese Unexamined Patent Application, First Publication No. 2014-60206
[Patent Document 2]
Japanese Unexamined Patent Application, First Publication No. 2010-112293

SUMMARY OF INVENTION

Technical Problem

In a controller disclosed in Patent Document 2, since an electronic component is configured as an integrated circuit, there is a possibility of variation of a driven electric body to which this device for driving a motor can be applied being limited. Also, to resolve this problem, although disposing the electronic components outside the integrated circuit can be considered, integral molding of the electronic components and the integrated circuit is difficult in terms of configuration of the mold. Therefore, it may be difficult to provide a controller that has an excellent waterproof property, durability, and wide applicability.

The present invention provides a controller and a method of manufacturing a controller which has an excellent waterproof property and durability, and is capable of improving applicability.

Solution to Problem

According to a first aspect of the present invention, provided is a controller in which a plurality of terminals, an electronic component connected to the terminals, and a power device connected to the terminals and configured to supply power to a driven body and control driving of the driven body are embedded inside a resin main body, and a connector portion into which a connector extending from an external device is able to be fitted is integrally molded, wherein the resin main body includes a primary molded portion integrated with the terminals using a resin, causing one end of the terminals to function as a connector terminal which protrudes into the connector portion, and configured to form a disposition portion of the electronic component and the power device, and a secondary molded portion integrated with the electronic component, the power device, and the primary molded portion in a state in which the electronic component and the power device are disposed at the disposition portion.

With the configuration described above, the primary molded portion, the electronic component, and the power device can be collectively integrated using a resin by the secondary molded portion after the electronic component and the power device are disposed at the primary molded portion which is formed with a resin and the terminal. Accordingly, airtightness inside the controller can be enhanced. Also, since airtightness is enhanced by the resin and the resin has higher thermal conductivity than air, a heat-dissipation property can be enhanced. Also, since a fixing structure for the electronic component and the power device and a stress relaxation structure for each terminal of the electronic component and the power device are unnecessary, a separate vibration countermeasure is unnecessary. Further, since the electronic component is provided separately from the power device in the manner of being set in the primary molded portion, the electronic component can be appropriately changed according to a specification. Therefore, the controller that has an excellent waterproof property and durability and is capable of improving applicability can be obtained.

According to a second aspect of the present invention, in the controller according to the first aspect of the present invention, an attachment portion for fixing the secondary molded portion to a member to be attached may be integrally molded with the secondary molded portion.

With the configuration described above, attachment to a member to be attached can be easily performed without providing a separate structure for attaching.

According to a third aspect of the present invention, in the controller according to the first or the second aspect of the present invention, the secondary molded portion may be formed of a thermally conductive resin.

With the configuration described above, since the secondary molded portion is formed of a thermally conductive resin, heat generated at the electronic component and the power device which are integrated with the secondary molded portion can be efficiently dissipated to the outside via the secondary molded portion.

According to a fourth aspect of the present invention, in the controller according to the third aspect of the present invention, a heat sink may be integrally provided in the secondary molded portion, the power device and the heat sink may be separately disposed, and the power device and the heat sink may be in contact with each other via the thermally conductive resin.

With the configuration described above, since the heat sink is provided in the secondary molded portion, it is possible to enhance heat-dissipation characteristics without providing a separate heat-dissipating mechanism. Furthermore, since the power device and the heat sink are in contact with each other via the thermally conductive resin, heat generated at the power device can be transferred to the heat sink without a heat-dissipation sheet interposed between the power device and the heat sink. Accordingly, heat-dissipation characteristics can be enhanced with a simple configuration.

According to a fifth aspect of the present invention, in the controller according to the fourth aspect of the present invention, the heat sink may be electrically connected to the terminal.

With the configuration described above, the terminal can be easily grounded via an exposed portion of the heat sink.

According to a sixth aspect of the present invention, in the controller according to any one of the first to fifth aspects of the present invention, the electronic component may include at least any one of the group consisting of a noise suppression device and a smoothing capacitor.

With the configuration described above, a noise suppression circuit and a smoothing circuit can be formed inside the resin main body having an excellent waterproof property, and thereby a waterproof property and durability of the controller can be further enhanced.

According to a seventh aspect of the present invention, in the controller according to any one of the first to sixth aspects of the present invention, the electronic component and the power device may be disposed on the same plane.

With the configuration described above, an increase in thickness of the controller can be suppressed.

According to an eighth aspect of the present invention, in the controller according to any one of the first to seventh aspects of the present invention, the disposition portion may be formed to accommodate at least a portion of the electronic component.

With the configuration described above, occurrence of a positional deviation of the electronic component disposed at the disposition portion when the secondary molded portion is formed can be prevented.

According to a ninth aspect of the present invention, in the controller according to any one of the first to eighth aspects of the present invention, a window portion which exposes a junction portion between the electronic component and the terminal may be formed in the primary molded portion.

With the configuration described above, since space is provided around the junction portion due to the window portion, the electronic component and the terminal can be easily connected via the window portion with respect to the primary molded portion. Further, when resistance welding or the like is used as a connecting method, for example, workability at the time of welding can be enhanced and thermal influence of the welding on the primary molded portion can be sufficiently suppressed.

According to a tenth aspect of the present invention, provided is a method of manufacturing a controller in which a plurality of terminals, an electronic component connected to the terminal, and a power device connected to the terminal and configured to supply power to a driven body and control driving of the driven body are embedded inside a resin main body, and a connector portion into which a connector extending from an external device is able to be fitted is integrally molded, the method including a primary molding process of forming a primary molded portion integrated with the terminals using a resin, causing one end of the terminals to function as a connector terminal which protrudes into the connector portion and configured to form a disposition portion of the electronic component and the power device, and a secondary molding process of forming a secondary molded portion integrated with the electronic component, the power device, and the primary molded portion in a state in which the electronic component and the power device are disposed at the disposition portion.

With the configuration described above, the primary molded portion, the electronic component, and the power device can be collectively integrated using a resin by the secondary molded portion after the electronic component and the power device are disposed at the primary molded portion which is formed with the resin and the terminals. Accordingly, airtightness inside the controller can be enhanced. Also, since airtightness is enhanced by the resin and the resin has higher thermal conductivity than air, a heat-dissipation property can be enhanced. Also, since a fixing structure for the electronic component and the power device and a stress relaxation structure for each terminal of the electronic component and the power device are unnecessary, a separate vibration countermeasure is unnecessary. Further, since the electronic component is provided separately from the power device and is set in the primary molded portion, a controller in which the electronic component can be appropriately changed according to a specification can be manufactured without using a complicated mold. Therefore, the controller that has an excellent waterproof property and durability and is capable of improving applicability can be easily manufactured.

According to an eleventh aspect of the present invention, the method of manufacturing the controller according to the tenth aspect of the present invention may include a connecting process of electrically connecting the electronic component and the power device which are disposed at the disposition portion to the terminals between the primary molding process and the secondary molding process.

With the configuration described above, the electronic component and the power device can be electrically connected to the terminals in a state in which the electronic component and the power device are disposed at the disposition portion of the primary molded portion. Thereby, a positional deviation of the electronic component and the power device can be suppressed.

Advantageous Effects of Invention

According to the controller described above, the primary molded portion, the electronic component, and the power device can be collectively integrated using a resin by the secondary molded portion after the electronic component and the power device are disposed at the primary molded portion which is formed with a resin and the terminal. Accordingly, airtightness inside the controller can be enhanced. Also, since airtightness is enhanced by the resin and the resin has a higher thermal conductivity than air, the heat-dissipation property can be enhanced. Also, since a fixing structure for the electronic component and the power device and a stress relaxation structure for each terminal of the electronic component and the power device are unnecessary, a separate vibration countermeasure is unnecessary. Further, since the electronic component is provided separately from the power device in the manner of being set in the primary molded portion, the electronic component can be appropriately changed according to a specification. Therefore, a controller that has an excellent waterproof property and durability and is capable of improving applicability can be obtained.

According to the method of manufacturing a controller described above, the primary molded portion, the electronic component, and the power device can be collectively integrated using a resin by the secondary molded portion after the electronic component and the power device are disposed at the primary molded portion which is formed with a resin and the terminal. Accordingly, airtightness inside the controller can be enhanced. Also, since airtightness is enhanced by the resin and the resin has higher thermal conductivity than air, a heat-dissipation property can be enhanced. Also, since a fixing structure for the electronic component and the power device and a stress relaxation structure for each terminal of the electronic component and the power device are unnecessary, a separate vibration countermeasure is unnecessary. Further, since the electronic component is provided separately from the power device and is set in the primary molded portion, a controller in which the electronic component can be appropriately changed according to a specification can be manufactured without using a complicated mold. Therefore, the controller that has an excellent waterproof property and durability and is capable of improving applicability can be easily manufactured.

DESCRIPTION OF EMBODIMENTS

Hereinafter, embodiments of the present invention will be described on the basis of the accompanying drawings. Also, a motor will be taken as an example of a driven electric body driven and controlled by a controller 1 in the following description.

First Embodiment (Controller)

Figure 1:
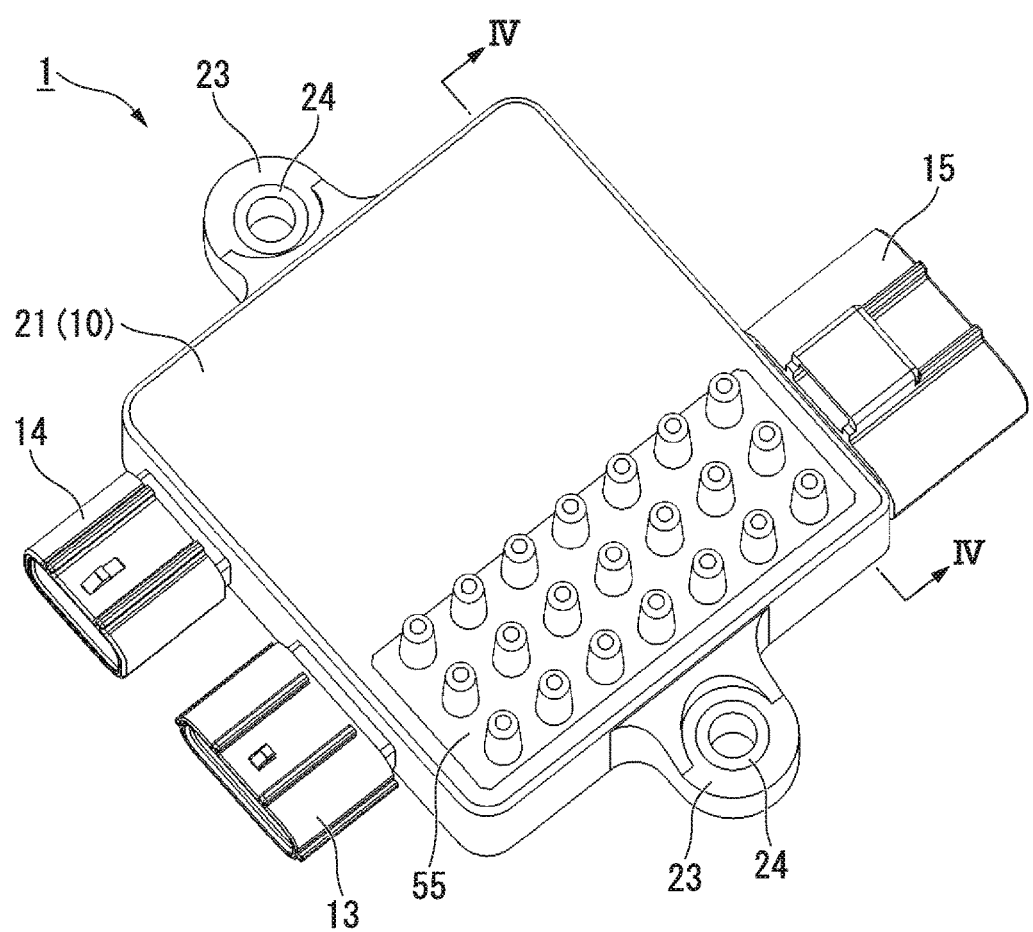
FIG. 1 is a perspective view of a controller of a first embodiment.
Figure 2:
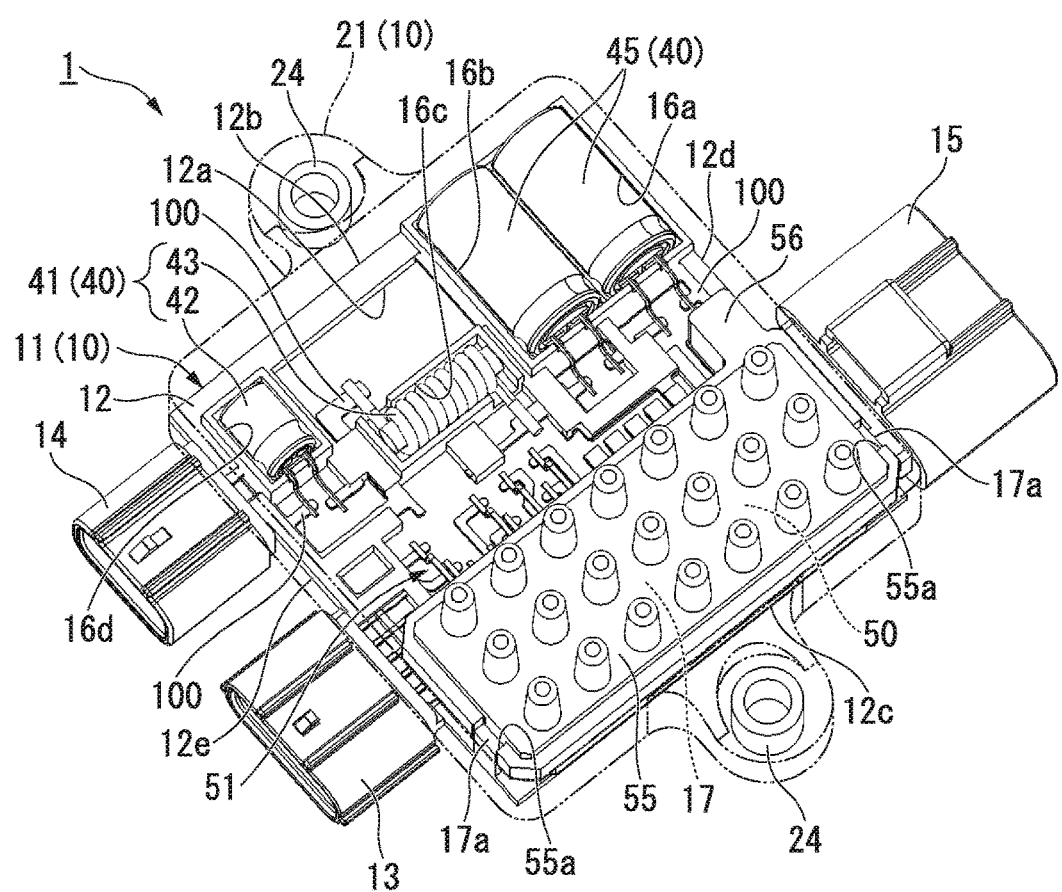
FIG. 2 is a perspective view in which a secondary molded portion of a controller of the first embodiment is transmitted.

FIG. 1 is a perspective view of a controller of a first embodiment. FIG. 2 is a perspective view in which a secondary molded portion of a controller of the first embodiment is transmitted.

As shown in FIGS. 1 and 2, the controller 1 drives and controls a motor. The controller 1 is attached to a motor case (a member to be attached) of the motor, for example. The controller 1 has a resin molded body 10 (a resin main body) which mainly constitutes a main body portion. A plurality of bus bars 100 (terminals), electronic components 40 connected to the bus bars 100, and a power device 50 connected to the bus bars 100 to supply power to the motor and control driving of the motor are embedded inside the resin molded body 10. Further, connector portions 13 to 15 (a first connector portion 13, a second connector portion 14, and a third connector portion 15) to which connectors (none is shown in the figure) extending from external devices can be fitted are integrally molded with the resin molded body 10.

The resin molded body 10 includes a primary molded portion 11 and a secondary molded portion 21.

As shown in FIG. 2, a base portion 12 and the connector portion 13 to 15 which protrude from the base portion 12 are integrally molded with the primary molded portion 11. The primary molded portion 11 is integrated with the plurality of bus bars 100 so that one ends of the bus bars 100 function as connector terminals which protrude into the connector portions 13 to 15. Further, electronic component disposition portions 16a to 16d in which electronic components 40 are disposed and a power device disposition portion 17 in which a power device 50 is disposed are formed in the primary molded portion 11.

The base portion 12 is formed in a substantially rectangular plate shape when viewed from an axis direction of the motor in a plan view and includes an edge side 12b, an edge side 12c which faces the edge side 12b, and a pair of edge sides 12d and 12e perpendicular to the edge sides 12b and 12c. A plurality of window portions 12a which expose junction portions of the electronic components 40 and the power device 50 with the bus bars 100, the four electronic component disposition portions 16a to 16d (a first disposition portion 16a, a second disposition portion 16b, a third disposition portion 16c, and a fourth disposition portion 16d) in which the electronic components 40 are disposed, and the power device disposition portion 17 in which the power device 50 is disposed are formed in the base portion 12.

The window portion 12a is formed in most of substantially half of the base portion 12 and is formed to pass through a thickness direction of the base portion 12 (hereinafter, simply referred to as a "thickness direction").

In a region in which the window portion 12a of the base portion 12 is formed, the first disposition portion 16a, the second disposition portion 16b, the third disposition portion 16c, and the fourth disposition portion 16d are sequentially formed to be aligned along the edge side 12b from the edge side 12d toward the edge side 12e. Each of the electronic component disposition portions 16a to 16d is capable of accommodating the electronic components 40 and is formed in a concave shape opened toward one side of the thickness direction.

Figure 7:
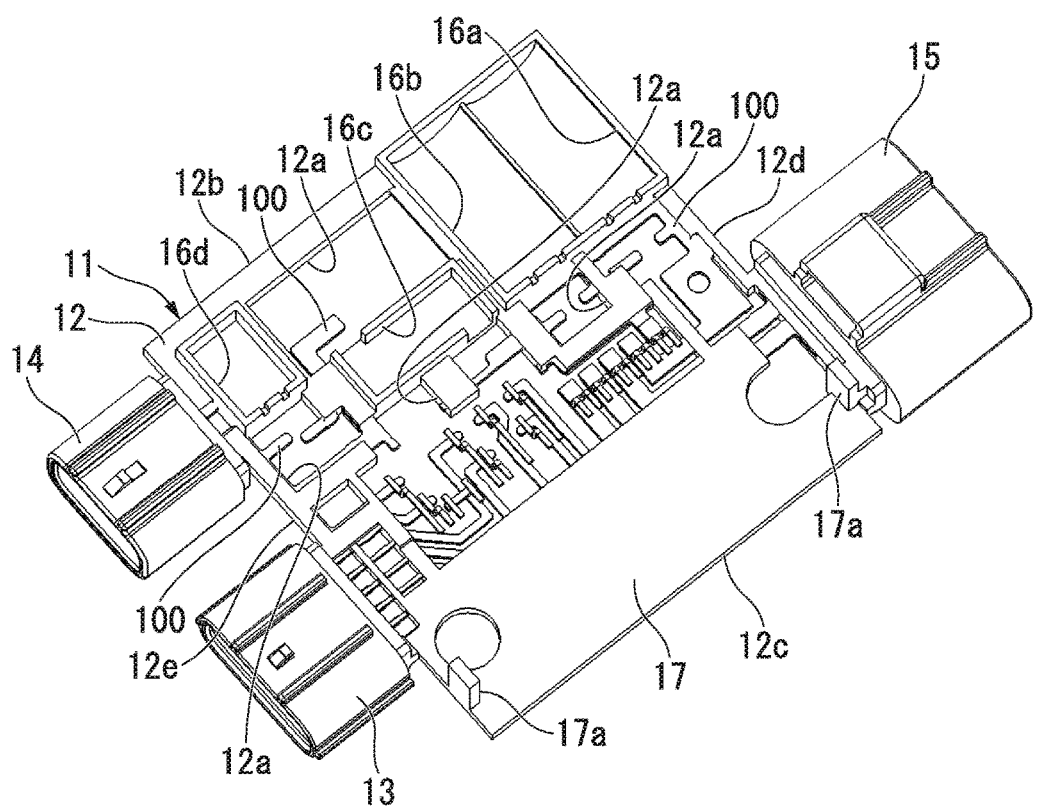
FIG. 7 is a process flow diagram showing a method of manufacturing a controller of the first embodiment.

The power device disposition portion 17 is formed in a rectangular plate shape and is disposed in substantially half of the base portion 12 along the entire edge side 12c at the opposite side of the window portion 12a (see FIG. 7). Also, a pair of positioning protrusions 17a are individually erected toward one side of the thickness direction in the power device disposition portion 17 at corresponding positions on the pair of edge sides 12d and 12e. The pair of positioning protrusions 17a position the power device.

The connector portions 13 to 15 individually protrude from an outer peripheral edge of the base portion 12 in a surface direction of the base portion 12. Specifically, the first connector portion 13 is formed on the edge side 12e at a portion close to a joining portion with the edge side 12c. The second connector portion 14 is formed on the edge side 12e at a portion close to a joining portion with the edge side 12b. The third connector portion 15 is formed on the edge side 12d at a portion close to a joining portion with the edge side 12c.

The plurality of bus bars 100 are embedded in the primary molded portion 11 formed as described above.

Figure 3:
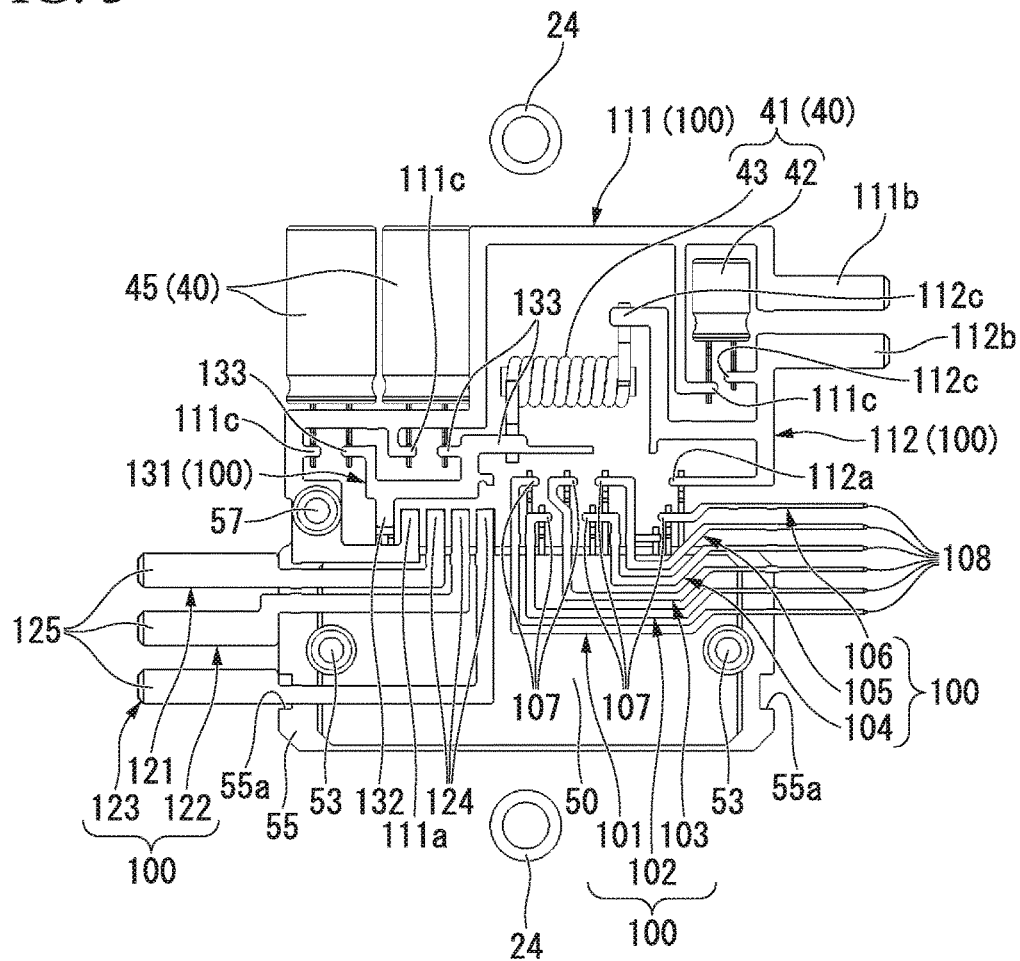
FIG. 3 is a bottom view in which a primary molded portion and a secondary molded portion of a controller of the first embodiment are transmitted.

FIG. 3 is a bottom view in which a primary molded portion and a secondary molded portion of a controller of the first embodiment are transmitted.

As shown in the drawing, the plurality of bus bars 100 include signal system terminal bus bars 101 to 106, power terminal bus bars 111 and 112 (a first power terminal bus bar 111 and a second power terminal bus bar 112), three-phase bus bars 121 to 123, and a power bus bar 131. Each of the plurality of bus bars 100 is formed in a desired shape by a press process or the like of a metal plate such as copper, for example. The plurality of bus bars 100 are laterally disposed side by side on the same plane without intersecting at all. Therefore, they are configured to suppress the occurrence of noise due to crosstalk.

As shown in FIGS. 2 and 3, the signal system terminal bus bars 101 to 106 are disposed in the vicinity of the first connector portion 13. The signal system terminal bus bars 101 to 106 individually include power device side end portions 107 which protrude into the window portion 12a of the base portion 12 and connector side end portions 108 which protrude into the first connector portion 13.

The signal system terminal bus bars 101 to 106 are provided as communication lines with external devices such as an engine control unit (ECU) or the like. The signal system terminal bus bars 101 to 106 are mainly used for inputting a target rotation speed of the motor, outputting a rotation speed of the motor, setting a function of the power device 50, and outputting information on an error state. Since the signal system terminal bus bars 101 to 106 are provided for setting a function of the power device 50, it is possible to perform setting change of a function of the controller 1 in a product state and thereby development productivity can be enhanced. Also, since the signal system terminal bus bars 101 to 106 are provided for outputting information on an error state, it is possible to determine the type of an error that occurs and thereby efficiency of failure analysis can be enhanced. Further, since a rotation speed of the motor is output (fed back) from the signal system terminal bus bars 101 to 106 to a host ECU so that the host ECU can adjust the rotation speed of the motor as needed, an effect of suppressing unnecessary power consumption (electricity cost) can be achieved.

The first power terminal bus bar 111 is disposed to bypass the first disposition portion 16a and the second disposition portion 16b in the region along the edge side 12d from the edge side 12b of the base portion 12. The first power terminal bus bar 111 includes a power device side end portion 111a which protrudes into the window portion 12a of the base portion 12, a connector side end portion 111b which protrudes into the second connector portion 14, and three tongue portions 111c which protrude into the window portion 12a of the base portion 12 from a crossing portion which connects the pair of end portions 111a and 111b.

The second power terminal bus bar 112 is disposed between the signal system terminal bus bars 101 to 106 and the first power terminal bus bar 111 in the base portion 12. The second power terminal bus bar 112 includes a power device side end portion 112a which protrudes into the window portion 12a of the base portion 12, a connector side end portion 112b which protrudes into the second connector portion 14, and two tongue portions 112c which protrude into the window portion 12a of the base portion 12 from a crossing portion which connects the pair of end portions 112a and 112b.

The three-phase bus bars 121 to 123 are disposed in the vicinity of the third connector portion 15. The three-phase bus bars 121 to 123 include power device side end portions 124 which protrude into the window portion 12a of the base portion 12, and connector side end portions 125 which protrude into the third connector portion 15.

The power bus bar 131 is disposed between the first power terminal bus bar 111 and the three-phase bus bars 121 to 123 in the base portion 12. The power bus bar 131 includes a power device side end portion 132 which protrudes into the window portion 12a of the base portion 12 and three tongue portions 133.

The electronic components 40 and the power device 50 are disposed on the same plane on a main surface at one side in the thickness direction of the primary molded portion 11 (the base portion 12) in which the plurality of bus bars 100 are embedded as described above. The electronic components 40 include a noise suppression device 41 and a pair of smoothing capacitors 45.

The noise suppression device 41 includes an X capacitor 42 and a choke coil 43.

The X capacitor 42 is provided mainly to suppress radio noise. The X capacitor 42 is an electrolytic capacitor in a substantially cylindrical shape, for example, and is disposed at the fourth disposition portion 16d of the base portion 12. The X capacitor 42 is disposed so that its center axis is parallel to an extending direction of the edge side 12d or 12e of the base portion 12.

Also, a ceramic capacitor or the like can be used as the X capacitor 42 in addition to the electrolytic capacitor such as an aluminum electrolytic capacitor, a conductive polymer capacitor, a niobium capacitor, or the like, for example.

Here, the aluminum electrolytic capacitor is designed to release a high temperature gas including an electrolyte by operating a pressure valve when internal pressure rises due to occurrence of an abnormality such as heat generation or the like. Thus, it is necessary to provide space around the pressure valve of the aluminum electrolytic capacitor for releasing a high temperature gas. On the other hand, since a solid capacitor such as a conductive polymer capacitor, a niobium capacitor, a ceramic capacitor, or the like does not have pressure valves, there is no need to provide space therearound. Therefore, it is easy to mold the secondary molded portion 21 to be described below.

The X capacitor 42 has a pair of lead portions extending from its end surface. Distal ends of the pair of lead portions of the X capacitor 42 are disposed in the window portion 12a and are electrically connected to the tongue portion 111c of the first power terminal bus bar 111 and the tongue portions 112c of the second power terminal bus bar 112 by resistance welding or the like, for example.

The choke coil 43 is provided mainly to suppress radio noise. The choke coil 43 is formed by winding a lead wire around a columnar core made of a magnetic material such as ferrite or the like. The choke coil 43 is disposed at the third disposition portion 16c of the base portion 12. The choke coil 43 is disposed so that its center axis is parallel to an extending direction of the edge side 12b or 12c of the base portion 12.

A pair of distal end portions of the lead wire of the choke coil 43 are individually disposed in the window portion 12a. The pair of distal end portions of the lead wire of the choke coil 43 are electrically connected to the tongue portions 112c of the second power terminal bus bar 112 and the tongue portions 133 of the power bus bar 131 by resistance welding or the like, for example.

The pair of smoothing capacitors 45 are provided for suppressing a change in voltage generated according to driving of the motor. Similar to the X capacitor 42, the pair of smoothing capacitors 45 are electrolytic capacitors in a cylindrical shape, for example, and are disposed at the first disposition portion 16a and the second disposition portion 16b of the base portion 12. Similar to the X capacitor 42, each of the smoothing capacitors 45 is disposed so that its center axis is parallel to an extending direction of the edge side 12d or 12e of the base portion 12.

Also, similar to the X capacitor 42, a ceramic capacitor or the like can be used as the smoothing capacitor 45 in addition to an electrolytic capacitor such as an aluminum electrolytic capacitor, a conductive polymer capacitor, a niobium capacitor, or the like, for example. However, the conductive polymer capacitor, the niobium capacitor, the ceramic capacitor, or the like, generally tend to have smaller electrostatic capacitance than an aluminum electrolytic capacitor of equivalent size. Therefore, when a conductive polymer capacitor, a niobium capacitor, a ceramic capacitor, or the like is used for the smoothing capacitor, it is preferable that a voltage (a current) be gradually changed by driving the motor in sine-wave drive control and wide-angle energization drive control. Also, when a conductive polymer capacitor, a niobium capacitor, a ceramic capacitor, or the like is used for the smoothing capacitor, it is possible to suppress a change in voltage by using a plurality of the capacitors to have electrostatic capacitance equivalent to the electrostatic capacitance in the case in which an aluminum electrolytic capacitor is used.

Each of the smoothing capacitors 45 has a pair of lead portions extending from its end surface. Distal ends of the pair of lead portions of each smoothing capacitor 45 are disposed in the window portion 12a and are electrically connected to the tongue portion 111c of the first power terminal bus bar 111 and the tongue portions 133 of the power bus bar 131 by resistance welding or the like, for example.

The power device 50 disposed at the power device disposition portion 17 of the base portion 12 is formed in a rectangular plate shape. The power device 50 is placed on the power device disposition portion 17 of the base portion 12 so that a longitudinal direction thereof is parallel to an extending direction of the edge side 12c of the base portion 12. In the power device 50, a circuit board on which electronic devices including a switching device or the like such as a field effect transistor (FET), an insulated gate bipolar transistor (IGBT), or the like, for example, are mounted is embedded inside a molded body such as an epoxy resin or the like, for example.

Also, a terminal row 51 is provided at one side of the power device 50. Terminals constituting the terminal row 51 protrude into the window portion 12a and are electrically connected to each of the power device side end portions 107, 111a, 112a, 124, and 132 of the bus bars 100.

As shown in FIG. 2, a heat sink 55 is placed on a main surface at one side in a thickness direction of the power device 50 with a heat-dissipation sheet (not shown) interposed therebetween. The heat sink 55 is formed in a rectangular shape slightly larger than the power device 50 when viewed from the thickness direction. The heat sink 55 has a plurality of pin shaped heat-dissipation fins erected in the thickness direction on the main surface of one side in the thickness direction. Also, notch portions 55a are individually formed in a pair of short sides of the heat sink 55. The heat sink 55 is placed on the power device 50 in a state in which the pair of notch portions 55a are individually engaged with the pair of positioning protrusions 17a of the power device disposition portion 17. The power device 50 and the heat sink 55 are fixed to each other by a pair of fastening members 53 while interposing the heat-dissipation sheet therebetween (see FIG. 3). When the heat-dissipation sheet is interposed between the power device 50 and the heat sink 55, adhesion of the heat-dissipation sheet with the power device 50 and the heat sink 55 is enhanced and heat generated at the power device 50 is easily transferred to the heat sink 55.

Figure 4:
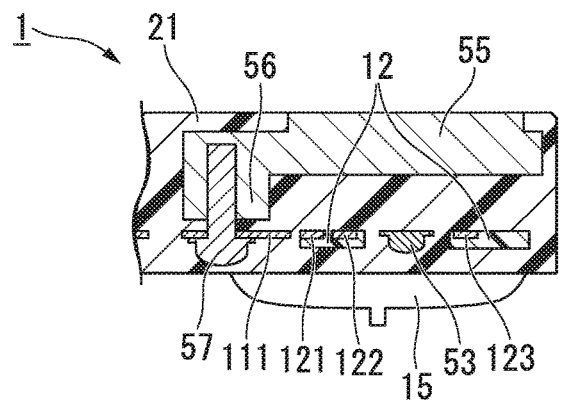
FIG. 4 is a cross-sectional view taken along line IV-IV of FIG. 1.

FIG. 4 is a cross-sectional view taken along line IV-IV of FIG. 1.

As shown in FIGS. 2 to 4, a grounding portion 56 is formed in the heat sink 55. The grounding portion 56 protrudes from a side surface on the side of the edge side 12b of the base portion 12 in the heat sink 55. The grounding portion 56 is fixed to the first power terminal bus bar 111 by a fastening member 57 having electrical conductivity to be electrically connected to the first power terminal bus bar 111.

As shown in FIGS. 1 and 2, the secondary molded portion 21 is integrated with the electronic components 40, the power device 50, and the primary molded portion 11 in a state in which the electronic components 40 are disposed at the electronic component disposition portions 16a to 16d of the primary molded portion 11 and the power device 50 and the heat sink 55 are disposed at the power device disposition portion 17. More specifically, the secondary molded portion 21 is formed in a substantially rectangular plate shape. A thickness direction of the secondary molded portion 21 is the same as the thickness direction of the base portion 12. The secondary molded portion 21 is formed to cover portions other than the connector portions 13 to 15 and the surface having the heat-dissipation fins of the heat sink 55 among the primary molded portion 11, the electronic components 40, the power device 50, and the heat sink 55.

Also, a pair of attachment portions 23 are integrally molded with the secondary molded portion 21. The pair of attachment portions 23 fix the controller 1 to a motor case. The pair of attachment portions 23 are formed to protrude from side surfaces of positions corresponding to the edge sides 12b and 12c of the base portion 12. Pipe-shaped collar members 24 formed of a metal material are individually insert-molded in the attachment portions 23.

(A Method of Manufacturing a Controller)

Next, a method of manufacturing the controller 1 of the present embodiment will be described on the basis of FIG. 1 and FIGS. 5 to 8.

Figure 5:
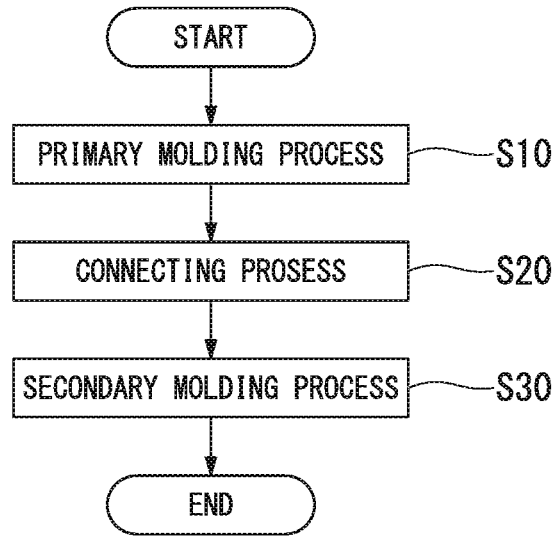
FIG. 5 is a flowchart showing a method of manufacturing a controller of the first embodiment.
Figure 6:
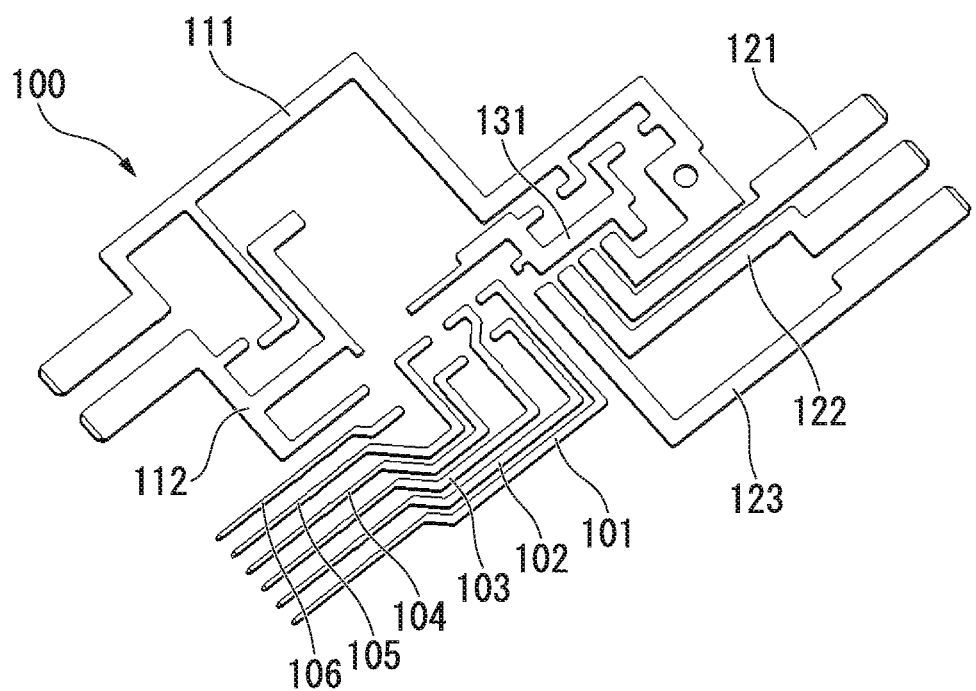
FIG. 6 is a process flow diagram showing a method of manufacturing a controller of the first embodiment.
Figure 8:
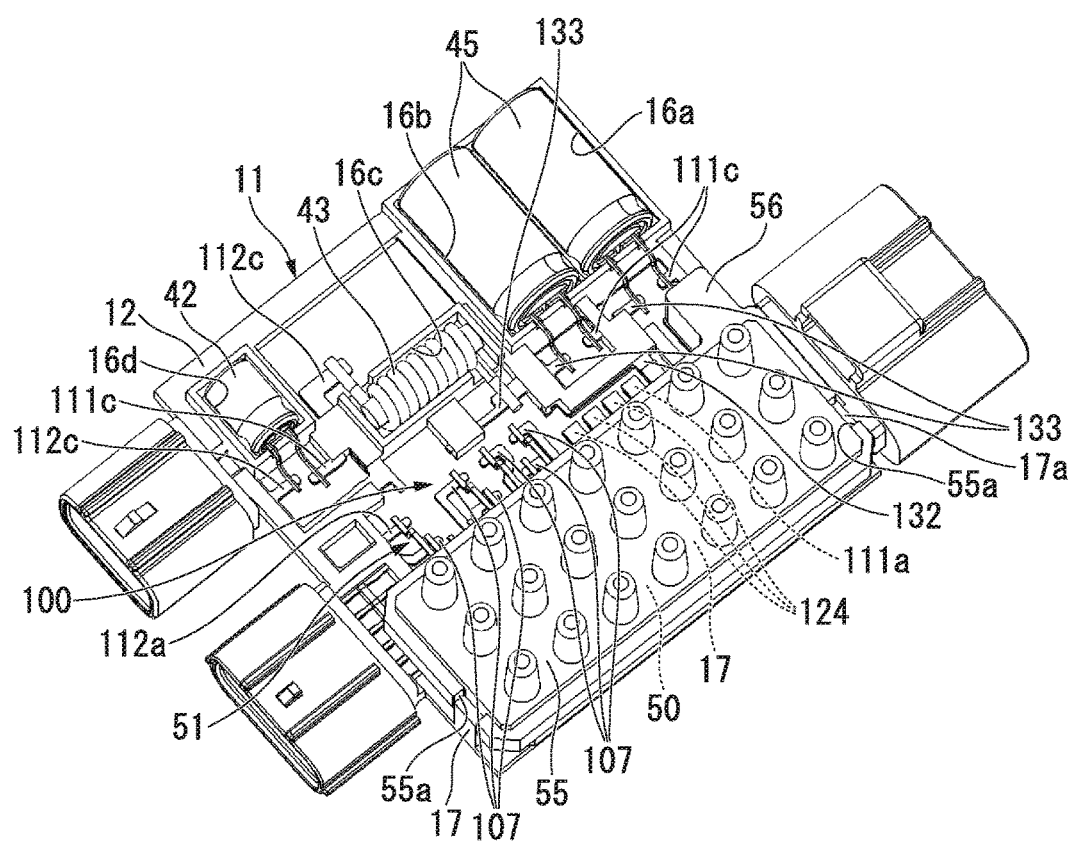
FIG. 8 is a process flow diagram showing a method of manufacturing a controller of the first embodiment.

FIG. 5 is a flowchart showing a method of manufacturing a controller of the first embodiment. FIGS. 6 to 8 are process flow diagrams showing a method of manufacturing a controller of the first embodiment.

As shown in FIG. 5, a method of manufacturing the controller 1 includes a primary molding process S10 of forming the primary molded portion 11, a connecting process S20 of electrically connecting the electronic components 40 disposed at the electronic component disposition portions 16a to 16d of the primary molded portion 11 and the power device 50 disposed at the power device disposition portion 17 to the bus bars 100, and a secondary molding process S30 of forming the secondary molded portion 21.

First, the primary molding process S10 is performed.

As shown in FIG. 6, in the primary molding process S10, a plurality of bus bars 100 are set in a mold (not shown) for molding the primary molded portion 11. At this time, the plurality of bus bars 100 may be connected to each other by a connecting portion (not shown). The plurality of bus bars 100 can be easily set in the mold because the plurality of bus bars 100 are connected to each other as described above.

Thereafter, as shown in FIG. 7, a resin is poured into the mold in which the bus bars 100 are set to be molded into the primary molded portion 11. At this time, when the plurality of bus bars 100 are connected by the connecting portion as described above, the connecting portion may be cut when a cavity part and a core part of the mold are clamped or a window portion for cutting the connecting portion may be formed at the primary molded portion 11 so that the connecting portion is cut via the window portion. Thereby, the primary molded portion 11 integrated with the plurality of bus bars 100 is molded and the primary molding process S10 is completed.

Next, the connecting process S20 is performed.

As shown in FIG. 8, in the connecting process S20, the electronic components 40 and the power device 50 are disposed in the primary molded portion 11 in which the plurality of bus bars 100 are integrated, and terminals thereof are electrically connected to the bus bars 100.

Specifically, the smoothing capacitors 45 are disposed at the first disposition portion 16a and the second disposition portion 16b of the base portion 12. Then, the distal ends of the pair of lead portions individually extending from each of the smoothing capacitors 45 are electrically connected to the tongue portion 111c of the first power terminal bus bar 111 and the tongue portions 133 of the power bus bar 131 by resistance welding or the like Also, the choke coil 43 is disposed at the third disposition portion 16c. Then, the pair of distal end portions of the lead wire of the choke coil 43 are welded to the tongue portions 112c of the second power terminal bus bar 112 and the tongue portions 133 of the power bus bar 131 by resistance welding or the like.

Also, the X capacitor 42 is disposed at the fourth disposition portion 16d. Then, the distal ends of the pair of lead portions extending from the X capacitor 42 are welded to the tongue portion 111c of the first power terminal bus bar 111 and the tongue portions 112c of the second power terminal bus bar 112 by resistance welding or the like.

Also, the power device 50 is disposed at the power device disposition portion 17. Further, the heat sink 55 is disposed on the power device 50 with a heat-dissipation sheet (not shown) interposed therebetween. At this time, the heat sink 55 can be accurately placed on the power device 50 by individually engaging the pair of notch portions 55a of the heat sink 55 with the pair of positioning protrusions 17a of the power device disposition portion 17. Next, the power device 50 and the heat sink 55 are fixed by the pair of fastening members 53 while interposing the heat-dissipation sheet therebetween. Thereafter, the grounding portion 56 of the heat sink 55 is fastened and fixed to the first power terminal bus bar 111 by the fastening member 57 (see FIG. 3). Then, the terminals of the terminal row 51 extending from the power device 50 are welded to each of the power device side end portions 107, 111a, 112a, 124, and 132 of the bus bars 100 by resistance welding or the like (see FIG. 3). Also, the heat sink 55 may be disposed on the power device 50 after the power device 50 and the bus bars 100 are welded together. Thereby, the connecting process S20 is completed.

Next, the secondary molding process S30 is performed.

In the secondary molding process S30, the primary molded portion 11 in which the electronic components 40 and the power device 50 are integrated and the collar members 24 (see FIG. 2) are set in a mold (not shown) for molding the secondary molded portion 21. Then, a resin is poured into the mold to mold the secondary molded portion 21. Thereby, the secondary molding process S30 is completed and the controller 1 shown in FIG. 1 is manufactured.

As described above, in the controller 1 of the present embodiment, the resin molded body 10 includes the primary molded portion 11 integrated with the bus bars 100 using a resin, causing one ends of the bus bars 100 to function as connector terminals which protrude into the connector portions 13 to 15, and configured to form the electronic component disposition portions 16a to 16d in which the electronic components 40 are disposed and the power device disposition portion 17 in which the power device 50 is disposed, and the secondary molded portion 21 integrated with the electronic components 40, the power device 50, and the primary molded portion 11 in a state in which the electronic components 40 are disposed at the electronic component disposition portions 16a to 16d and the power device 50 is disposed at the power device disposition portion 17.

According to this configuration, the primary molded portion 11, the electronic components 40, and the power device 50 can be collectively integrated using a resin by the secondary molded portion 21 after the electronic components 40 and the power device 50 are disposed in the primary molded portion 11 which is formed with the resin and the terminals. Therefore, airtightness inside the controller 1 can be enhanced.

Also, since airtightness is enhanced by the resin and the resin has higher thermal conductivity than air, a heat-dissipation property can be enhanced. Further, a fixing structure for the electronic components 40 and the power device 50 and a stress relaxation structure for each terminal of the electronic components 40 and the power device 50 are unnecessary, and thereby a separate vibration countermeasure is unnecessary.

Further, since the electronic components 40 are provided separately from the power device 50 in the manner of being set in the primary molded portion 11, the electronic components 40 can be appropriately changed according to a specification. Therefore, the controller 1 that has an excellent waterproof property and durability and is capable of improving applicability can be obtained.

Also, in the present embodiment, since the power device 50 is sealed in a resin molded body such as an epoxy resin or the like, exposure of joining portions such as soldered joints or the like is suppressed. Thereby, formation of the secondary molded portion 21 by insert-molding is further facilitated.

Also, since the attachment portions 23 are integrally molded with the secondary molded portion 21, attachment to a motor case can be easily performed without providing a separate structure for attaching.

Further, since the surface having the heat-dissipation fins of the heat sink 55 is provided to be exposed from the secondary molded portion 21, heat-dissipation characteristics can be enhanced without providing a separate heat-dissipating mechanism.

Also, since the heat sink 55 is electrically connected to the bus bars 100 (the first power terminal bus bar 111), the bus bars 100 can be easily grounded via the exposed portion of the heat sink 55.

Also, since the electronic components 40 include the noise suppression device 41 and the smoothing capacitors 45, a noise suppression circuit and a smoothing circuit can be formed inside the resin molded body 10 having an excellent waterproof property, and thereby a waterproof property and durability of the controller 1 can be further enhanced.

Also, since the electronic components 40 and the power device 50 are disposed on the same plane, an increase in thickness of the controller 1 can be suppressed.

Also, since the electronic component disposition portions 16a to 16d are formed to accommodate at least a portion of the electronic components 40, occurrence of a positional deviation of the electronic components 40 disposed at the electronic component disposition portions 16a to 16d can be prevented when the secondary molded portion 21 is formed.

Also, the window portion 12a which exposes junction portions of the electronic components 40 and the power device 50 with the bus bars 100 is formed in the primary molded portion 11. Therefore, the electronic components 40 and the power device 50 can be easily connected to the bus bars 100 via the window portion 12a with respect to the primary molded portion 11. Further, when resistance welding or the like is used as a connecting method, for example, workability at the time of welding is enhanced and also thermal influence of the welding on the primary molded portion 11 can be sufficiently suppressed.

The method of manufacturing the controller 1 of the present embodiment includes the primary molding process S10 of forming the primary molded portion 11 integrated with the bus bars 100, causing one ends of the bus bars 100 to function as connector terminals which protrude into the connector portions 13 to 15 and also configured to form the electronic component disposition portions 16a to 16d in which the electronic components 40 are disposed and the power device disposition portion 17 in which the power device 50 is disposed, and the secondary molding process S30 of forming the secondary molded portion 21 integrated with the electronic components 40, the power device 50, and the primary molded portion 11 in a state in which the electronic components 40 are disposed at the electronic component disposition portions 16a to 16d and the power device 50 is disposed at the power device disposition portion 17.

According to this method, the primary molded portion 11, the electronic components 40, the power device 50, and the heat sink 55 can be collectively integrated using a resin by the secondary molded portion 21 after the electronic components 40 and the power device 50 are disposed at the primary molded portion 11. Thus, airtightness inside the controller 1 can be enhanced.

Also, since the resin has higher thermal conductivity than air and airtightness is enhanced by the resin, a heat-dissipation property can be enhanced. Further, since a fixing structure for the electronic components 40 and the power device 50 and a stress relaxation structure for each terminal of the electronic components 40 and the power device 50 are unnecessary, a separate vibration countermeasure is unnecessary. Further, since the electronic components 40 are provided separately from the power device 50 and are set in the primary molded portion 11, a controller in which the electronic components 40 can be appropriately changed according to a specification can be manufactured without using a complicated mold. Therefore, the controller 1 which has an excellent waterproof property and durability and is capable of improving applicability can be easily manufactured.

Also, the connecting process S20 of electrically connecting the electronic components 40 disposed at the electronic component disposition portions 16a to 16d and the power device 50 disposed at the power device disposition portion 17 to the bus bars 100 is included between the primary molding process S10 and the secondary molding process S30.

According to this method, the electronic components 40 and the power device 50 can be electrically connected to the bus bars 100 in a state in which the electronic components 40 are disposed at the electronic component disposition portions 16a to 16d of the primary molded portion 11 and the power device 50 is disposed at the power device disposition portion 17 of the primary molded portion 11. Thereby, a positional deviation of the electronic components 40 and the power device 50 can be suppressed.

Second Embodiment (Controller)

Figure 9:
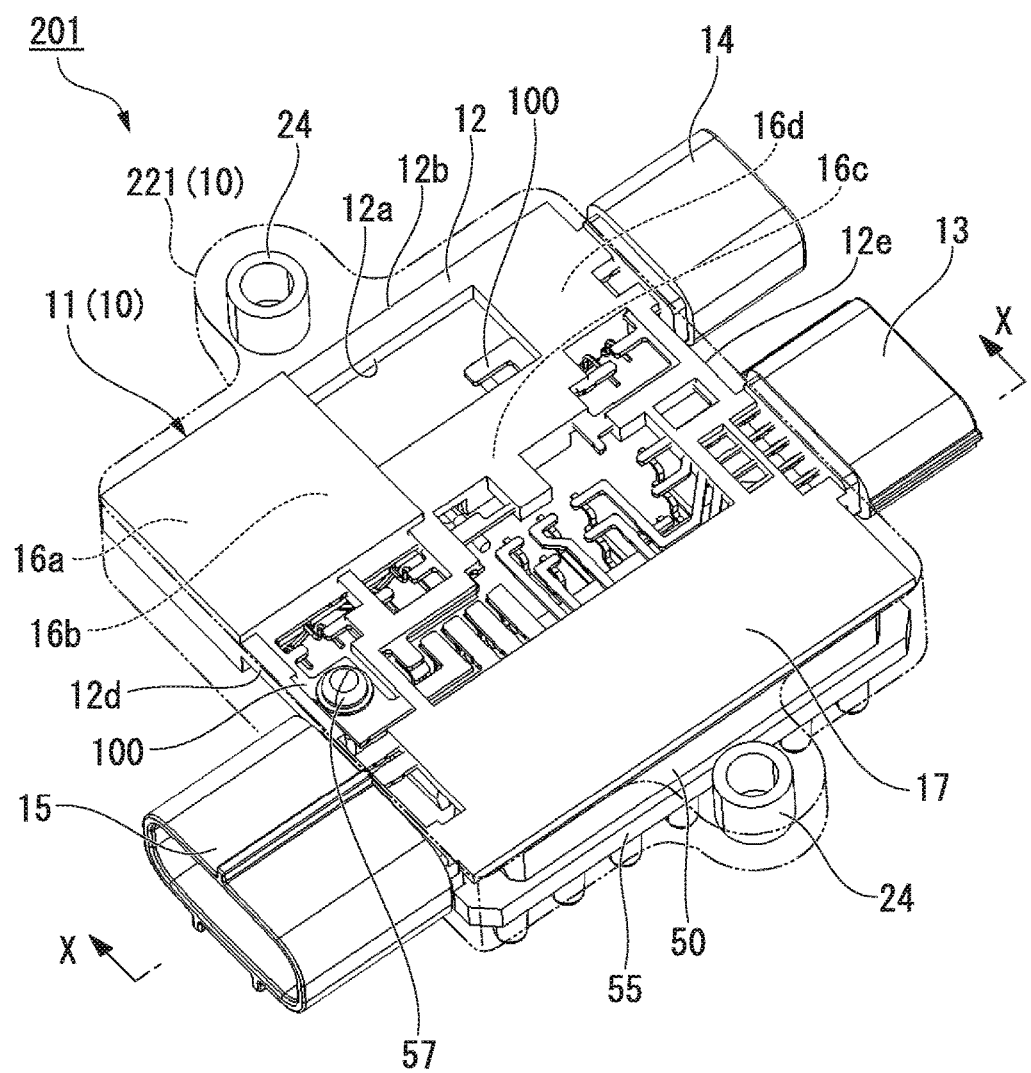
FIG. 9 is a perspective view in which a secondary molded portion of a controller of a second embodiment is transmitted.
Figure 10:
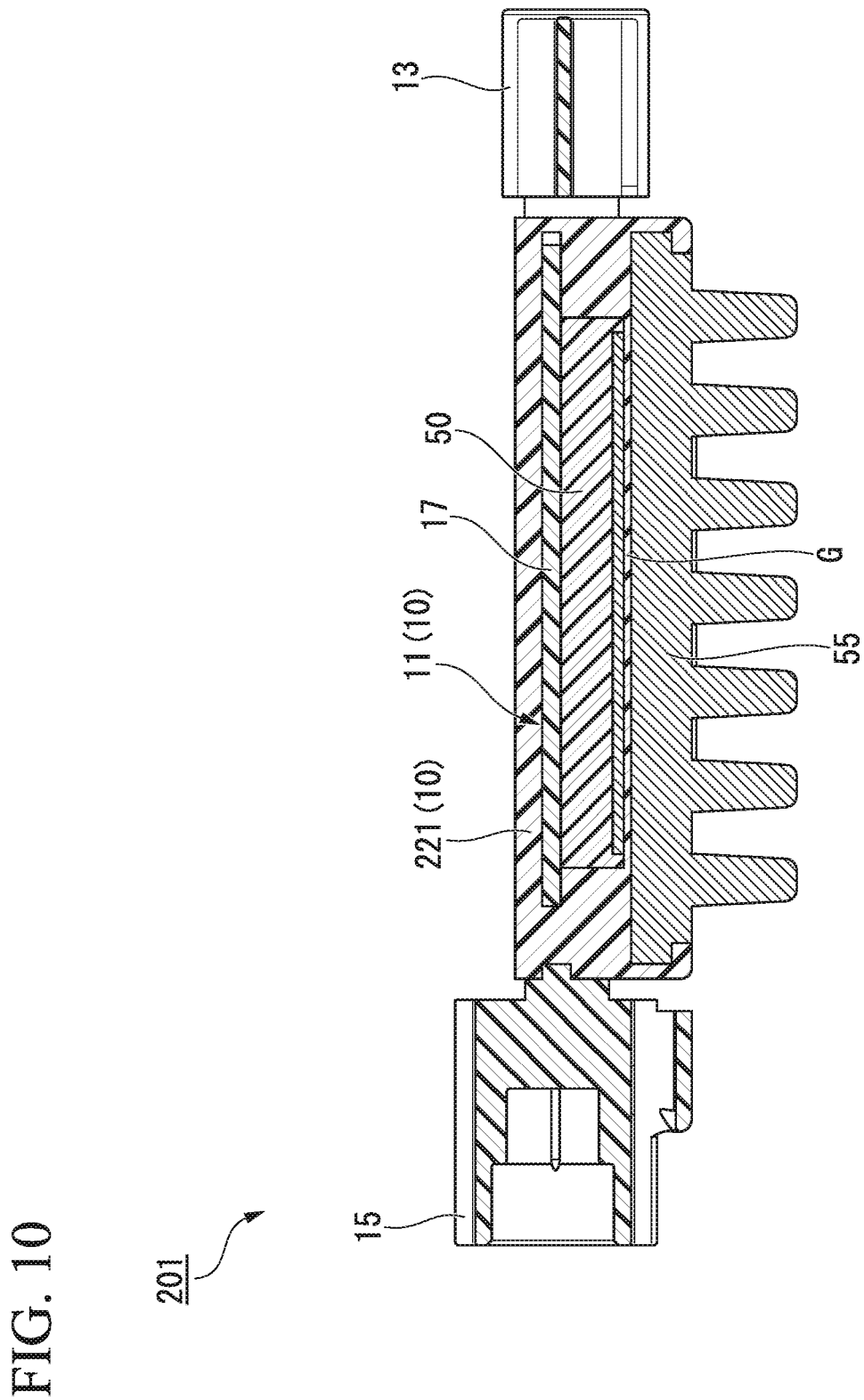
FIG. 10 is a cross-sectional view taken along line X-X of FIG. 9.

FIG. 9 is a perspective view in which a secondary molded portion of a controller of a second embodiment is transmitted. FIG. 10 is a cross-sectional view taken along line X-X of FIG. 9. Also, configurations similar to those of the first embodiment shown in FIGS. 1 to 4 will be designated by the same reference numerals and detailed description thereof will be omitted.

Here, in the first embodiment, the power device 50 and the heat sink 55 are in contact with each other via a heat-dissipation sheet (not shown). However, as shown in FIG. 10, in the second embodiment, a power device 50 and a heat sink 55 are in contact with each other via a secondary molded portion 221. This point is different from the first embodiment described above.

More specifically, as shown in FIGS. 9 and 10, the secondary molded portion 221 of a controller 201 is formed of a thermally conductive resin. It is preferable that the thermally conductive resin have excellent insulation and heat-resistance as well as high thermal conductivity, and polybutylene terephthalate, polyphenylene sulfide, a liquid crystal polymer, or the like can be used, for example.

The power device 50 and the heat sink 55 are separately disposed in a thickness direction. The thermally conductive resin which forms the secondary molded portion 221 is disposed in a gap portion G between the power device 50 and the heat sink 55. The power device 50 and the heat sink 55 are in contact with each other via the thermally conductive resin.

Based on the configuration above, the power device 50 is disposed at a power device disposition portion 17 first when the secondary molded portion 221 is formed. Next, terminals of a terminal row 51 which extends from the power device 50 are welded to each of the power device side end portions 107, 111a, 112a, 124, and 132 of bus bars 100 by resistance welding or the like. Also, a grounding portion 56 of the heat sink 55 is fastened and fixed to a first power terminal bus bar 111 by a fastening member 57. In this way, the power device 50 and the heat sink 55 are integrated with a primary molded portion 11 in a state in which the power device 50 and the heat sink 55 are separated in the thickness direction.

Next, the primary molded portion 11 integrated with electronic components 40, the power device 50, and the heat sink 55 is set in a mold together with a collar member 24, and the thermally conductive resin is poured into the mold. At this time, the molten thermally conductive resin flows between the power device 50 and the heat sink 55, and the thermally conductive resin adheres to the power device 50 and the heat sink 55.

According to this configuration, since the secondary molded portion 221 is formed of the thermally conductive resin, heat generated at the electronic components 40 and the power device 50 which are integrated with the secondary molded portion 221 can be efficiently dissipated to the outside via the secondary molded portion 221.

Also, the power device 50 and the heat sink 55 are in contact with each other via the thermally conductive resin (the secondary molded portion 221). Therefore, heat generated at the power device 50 can be transferred to the heat sink 55 without a heat-dissipation sheet interposed between the power device 50 and the heat sink 55. Thus, the fastening members 53 used for interposing the heat-dissipation sheet between the power device 50 and the heat sink 55 in the first embodiment shown in FIG. 3 are also unnecessary. Accordingly, heat-dissipation characteristics can be enhanced with a simple configuration.

It is to be noted that the present invention is not limited to the embodiments described above with reference to the drawings and various modifications can be considered in the technical scope thereof.

For example, in the above-described embodiments, the first power terminal bus bar 111 is grounded by being connected to the heat sink 55, but the present invention is not limited thereto. The first power terminal bus bar 111 may be connected to the collar member 24 exposed to the outside in the attachment portions 23, for example. Also, the first power terminal bus bar 111 can be grounded via the collar member 24 by connecting the collar member 24 to a motor case or the like.

Although the heat sink has the heat-dissipation fins in the above-described embodiments, the present invention is not limited thereto, and the heat-dissipation fins may not be provided but the surface thereof may be provided as a flat surface that may be directly brought into contact with a housing such as a motor or the like so that heat may be dissipated via the housing, for example.

Although connection of the bus bars 100 to the electronic components 40 and the power device 50 is performed by resistance welding in the above-described embodiments, the present invention is not limited thereto, and the connection may be performed by arc welding such as tungsten-electrode inert gas (TIG) welding or the like, laser welding, or the like, for example.

In addition, the components in the above-described embodiments can be appropriately replaced with well-known components without departing from the spirit and scope of the present invention.

INDUSTRIAL APPLICABILITY

According to the controller described above, a primary molded portion, an electronic component, and a power device can be collectively integrated using a resin by a secondary molded portion after the electronic component and the power device are disposed at the primary molded portion which is formed with a resin and terminals. Accordingly, airtightness inside the controller can be enhanced. Also, since airtightness is enhanced by the resin and the resin has a higher thermal conductivity than air, the heat-dissipation property can be enhanced. Also, since a fixing structure for the electronic component and the power device and a stress relaxation structure for each terminal of the electronic component and the power device are unnecessary, a separate vibration countermeasure is unnecessary. Further, since the electronic component is provided separately from the power device in the manner of being set in the primary molded portion, the electronic component can be appropriately changed according to a specification. Therefore, a controller that has an excellent waterproof property and durability and is capable of improving applicability can be obtained.

REFERENCE SIGNS LIST

1, 201 Controller
10 Resin molded body (resin main body)
11 Primary molded portion
12*a* Window portion
13 First connector portion (connector portion)
14 Second connector portion (connector portion)
15 Third connector portion (connector portion)
16*a*, 16*b*, 16*c*, 16*d* Electronic component disposition portion (disposition portion)
17 Power device disposition portion 17
21, 221 Secondary molded portion
23 Attachment portion
40 Electronic component
41 Noise suppression device
45 Smoothing capacitor
50 Power device
55 Heat sink
100 Bus bar (terminal)

The invention claimed is:

1. A controller in which a plurality of terminals, an electronic component connected to the terminal, and a power device connected to the terminal and configured to supply power to a driven body and control driving of the driven body are embedded inside a resin main body, and a connector portion to which a connector extending from an external device is able to be fitted is integrally molded,
wherein the resin main body comprises:
a primary molded portion integrated with the terminal using a resin, causing one end of the terminal to function as a connector terminal which protrudes into the connector portion, and configured to form a disposition portion of the electronic component and the power device; and
a secondary molded portion integrated with the electronic component, the power device, and the primary molded portion in a state in which the electronic component and the power device are disposed at the disposition portion, wherein the secondary molded portion is formed of a thermally conductive resin, and wherein a heat sink is integrally provided in the secondary molden portion, the power device and the heat sink are seperatly disposed, and the power device and the heat sink are in contact with each other via thermally conductive resin.

2. The controller according to claim 1, wherein an attachment portion for fixing the secondary molded portion to a member to be attached is integrally molded with the secondary molded portion.

3. The controller according to claim 1, wherein the heat sink is electrically connected to the terminal.

4. The controller according to claim 1, wherein the electronic component includes at least any one of the group consisting of a noise suppression device and a smoothing capacitor.

5. The controller according to claim 1, wherein the electronic component and the power device are disposed on the same plane.

6. The controller according to claim 1, wherein the disposition portion is formed to accommodate at least a portion of the electronic component.

7. The controller according to claim 1, wherein a window portion that exposes a junction portion between the electronic component and the terminal is formed in the primary molded portion.

8. A method of manufacturing a controller in which a plurality of terminals, an electronic component connected to the terminals, and a power device connected to the terminals and configured to supply power to a driven body and control driving of the driven body are embedded inside a resin main body, and a connector portion to which a connector extending from an external device is able to be fitted is integrally molded, the method comprising:

a primary molding process of forming a primary molded portion integrated with the terminals using a resin, causing one end of the terminals to function as a connector terminal which protrudes into the connector portion, and configured to form a disposition portion of the electronic component and the power device; and a secondary molding process of forming a secondary molded portion integrated with the electronic component, the power device, and the primary molded portion in a state in which the electronic component and the power device are disposed at the disposition portion, wherein the secondary molded portion is formed of a thermally conductive resin, and wherein a heat sink is integrally provided in the secondary molded portion, the power device and the heat sink are separately disposed, and the power device and the heat sink are in contact with each other via the thermally conductive resin.

9. The method according to claim 8, comprising a connecting process of electrically connecting the electronic component and the power device which are disposed at the disposition portion to the terminals between the primary molding process and the secondary molding process.

* * * * *